United States Patent [19]
Petri

[11] Patent Number: 6,038,140
[45] Date of Patent: Mar. 14, 2000

[54] GROUNDING CIRCUIT BOARD STANDOFF

[76] Inventor: Hector D. Petri, 384 Edmands Rd., Framingham, Mass. 01701

[21] Appl. No.: 09/224,010

[22] Filed: Dec. 31, 1998

[51] Int. Cl.⁷ ....................................................... H05K 1/14
[52] U.S. Cl. ...................... 361/804; 361/742; 174/138 G; 439/74
[58] Field of Search ..................... 361/742, 803, 361/804; 174/138 D, 138 G; 439/66, 74, 92, 95, 567

[56] References Cited

U.S. PATENT DOCUMENTS

| | | | |
|---|---|---|---|
| 3,651,545 | 3/1972 | Hara | 24/305 |
| 4,664,458 | 5/1987 | Worth | 439/66 |
| 4,781,488 | 11/1988 | Hayashi | 174/138 D |
| 4,952,158 | 8/1990 | Nakagawa | 439/96 |
| 5,281,149 | 1/1994 | Petri | 439/66 |
| 5,345,366 | 9/1994 | Cheng et al. | 174/138 G |
| 5,380,211 | 1/1995 | Kawaguchi et al. | 439/74 |
| 5,452,184 | 9/1995 | Scholder et al. | 361/799 |

Primary Examiner—Leo P. Picard
Assistant Examiner—John B. Vigushin
Attorney, Agent, or Firm—John E. Toupal; Harold G. Jarcho

[57] ABSTRACT

A circuit board standoff including a body for disposition between first and second boards so as to maintain a predetermined minimum spacing between substantially parallel facing inner surfaces thereof; the body having at one end a first abutment surface for engaging an inner surface portion of the first board and at an opposite end a second abutment surface for engaging an inner surface portion of the second board. A longitudinal axis of the body is aligned with the first abutment surface and the second abutment surface. Extending from the first abutment surface is a first latch shaped and arranged to project through an opening in the first board and into latching engagement therewith and extending from the second abutment surface is a second latch shaped and arranged to project through an opening in the second board and into latching engagement therewith.

18 Claims, 5 Drawing Sheets

GROUNDING CIRCUIT BOARD STANDOFF

BACKGROUND OF THE INVENTION

This invention relates generally to electrical circuit board apparatus and, more particularly, to improved standoff elements for separating and supporting printed circuit boards.

Printed circuit boards are used extensively in various types of electrical equipment. Typically, standoff elements are used to support and provide spacing for circuit boards. Standoffs are used, for example, to separate, support and electrically insulate a printed circuit board from either a metal chassis or other printed circuit boards. In many applications, separated circuit boards include ground circuits that must be interconnected. Standoff elements of that type are disclosed, for example, in U.S. Pat. Nos. 4,952,158; 5,281,149; 5,345,366; 5,380,211 and 5,452,184. Such prior standoff elements exhibit certain deficiencies such as structural complexity, limited specialized use and high cost.

The object of this invention, therefore, is to provide an improved standoff device that can both separate and electrically ground printed circuit boards.

SUMMARY OF THE INVENTION

The invention is a circuit board standoff including a body for disposition between first and second boards so as to maintain a predetermined minimum spacing between substantially parallel facing inner surfaces thereof; the body having at one end a first abutment surface for engaging an inner surface portion of the first board and at an opposite end a second abutment surface for engaging an inner surface portion of the second board. A longitudinal axis of the body is aligned with the first abutment surface and the second abutment surface. Extending from the first abutment surface is a first latch shaped and arranged to project through an opening in the first board and into latching engagement therewith; and extending from the second abutment surface is a second latch shaped and arranged to project through an opening in the second board and into latching engagement therewith. The standoff is both inexpensive to fabricate and easy to use.

According to one feature of the invention, the first latch includes spaced apart, resilient first and second legs defining, respectively, first and second outer peripheral portions which are inwardly flexed by inner surface portions of the opening in the first board during passage therethrough. The resilient legs enhance retention of the standoff in the board opening.

According to another feature of the invention, the first and second legs define, respectively, first and second stem portions joining the body and the first and second peripheral portions, and the first and second stem portions are separated by a spacing less than the spacing between the first and second peripheral portions. The different spacing provides an annular slot for receiving the board after the peripheral portions have cleared the opening.

According to an additional feature of the invention, the first and second legs further define a latch surface extending between the stem and peripheral portions, and shaped and arranged to contact an outer surface portion of the first board. The latch surface firmly retains the assembled standoff within the board opening.

According to a further feature of the invention, the first and second latches are identical. The identical first and second latches provide secure retention of the standoff between the first and second boards.

According to yet another feature, the standoff includes a conductive spring contact member retained by the body and having a first contact surface shaped and arranged to engage a first conductive surface on the first board, and a second contact surface shaped and arranged to engage a second conductive surface on the second board. The spring contact member establishes a ground connection between the first and second boards.

According to still another feature of the invention, the contact member includes an elongated central portion retained by the body and first and second arm portions extending transversely from opposite ends of the central portion and defining, respectively, the first and second contact surfaces. The body defines a longitudinal recess retaining the central portion; the first and second arm portions project between, respectively, the stem portions of the first and second latch means; the body further defines transverse first and second recesses for receiving, respectively, the first and second arm portions; and the first and second arm portions project longitudinally beyond, respectively, the first and second abutment surfaces. These structural features establish a reliable ground connection with an easily fabricated and assembled standoff.

According to yet additional features of the invention, the first and second latches are shaped and arranged to project through circular openings substantially aligned with the longitudinal axis of the standoff body which together with the first latch and the second latch comprises an integrally molded unitary member. These features further simplify fabrication and use of the standoff.

BRIEF DESCRIPTION OF THE DRAWINGS

These and other objects and features of the invention will become more apparent upon a perusal of the following description taken in conjunction with the accompanying drawings wherein.

BRIEF DESCRIPTION OF THE PREFERRED EMBODIMENTS

Figure 1:
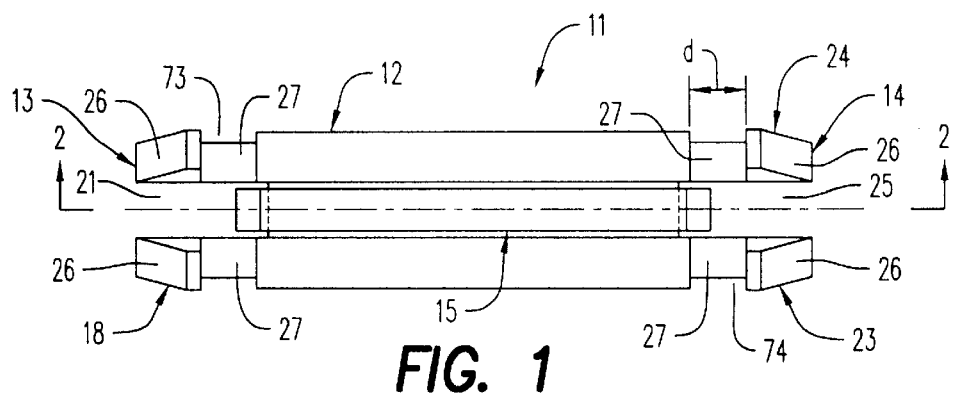
FIG. 1 is a top view of a standoff according to the invention.

A standoff 11 includes a body portion 12 straddled by a first latch portion 13 and a second latch portion 14. Also included in the standoff 11 is an electrically conductive, spring contact member 15 retained by the body portion 12. Preferably, the body portion 12 and first and second latch portions 13, 14 are integrally molded as a single unit, and the spring contact member 15 is formed with a suitable stamping procedure.

The body portion 12 is an elongated cylinder with a longitudinal axis x. Extending axially from one end of the body portion 12 is the first latch portion 13 while the second latch portion 14 extends axially from an opposite end of the body portion 12. The first latch portion 13 is formed by a pair of first and second transversely spaced apart, resilient legs 18, 19 which define a first slot 21. Similarly, the second latch portion 14 is formed by transversely spaced apart resilient first and second legs 23, 24 which define a second slot 25.

The legs 18, 19, 23 and 24 are identical and each includes a head portion 26 joined to the body portion 12 by a stem portion 27. As shown, the stem portions 27 have crescent shaped transverse cross-sections while the head portions 26 have cross-sections in the form of partial truncated cones. The outer surfaces of the stem portions 27 follow a circumference concentric with the cylindrical body portion 12 but with a smaller diameter so as to provide a first abutment surface 31 at one end of the body portion 12 and a second abutment surface 32 at the opposite end thereof. Outer peripheral edge portions 34, 35 of adjacent conical head portions 26 follow a circumference also concentric with the cylindrical body portion 12 but with a diameter larger than that of the stem portions 27 so as to form inwardly directed first and second latch surfaces 38, 39 at opposite ends of the body portion 12. The first and second latch surfaces 38, 39 are axially spaced from, respectively, the abutment surfaces 31, 32 by a distance d.

Figures 2, 3:
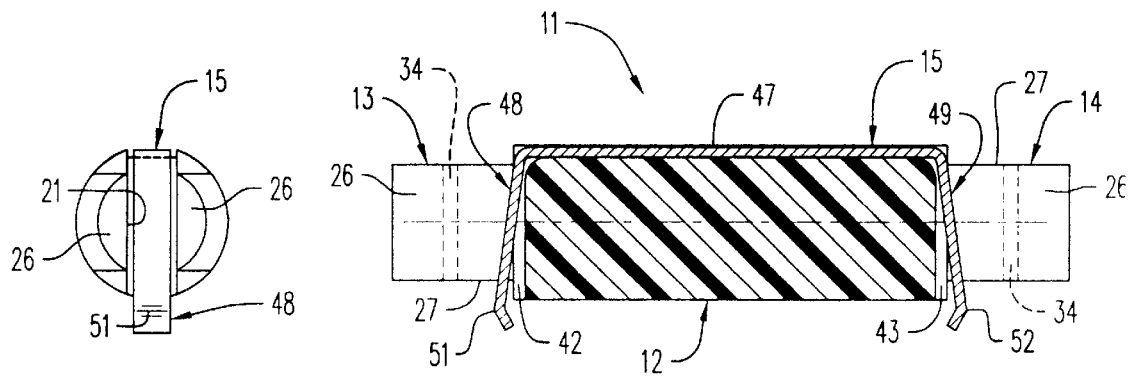
FIG. 2 is a cross sectional view taken along lines 2—2 of FIG. 1.
FIG. 3 is a left end view of the standoff shown in FIG. 2.

Defined by the outer cylindrical surface of the body portion 12 is a longitudinal recess 41. In addition, first and second transversely extending recesses 42, 43 are formed at opposite ends of the body portion 12 and intersect the longitudinal recess 41. The transverse recesses 42, 43 are aligned, respectively, with the first and second slots 21, 25 in the latch portions 13, 14. Received by the longitudinal recess 41 is an elongated central portion 47 of the spring contact member 15. First and second arm portions 48, 49 of the spring contact 15 extend transversely from opposite ends of the central portion 47 and are received, respectively, by the slots 21, 25 in the latches 13, 14. Outer ends of the first and second arm portions 48, 49 define, respectively, outwardly facing, first and second contact surfaces 51, 52 which project outwardly into the slots 21, 25 axially beyond the first and second abutment surfaces 31, 32, as shown most clearly in FIGS. 1 and 2.

Figure 7:
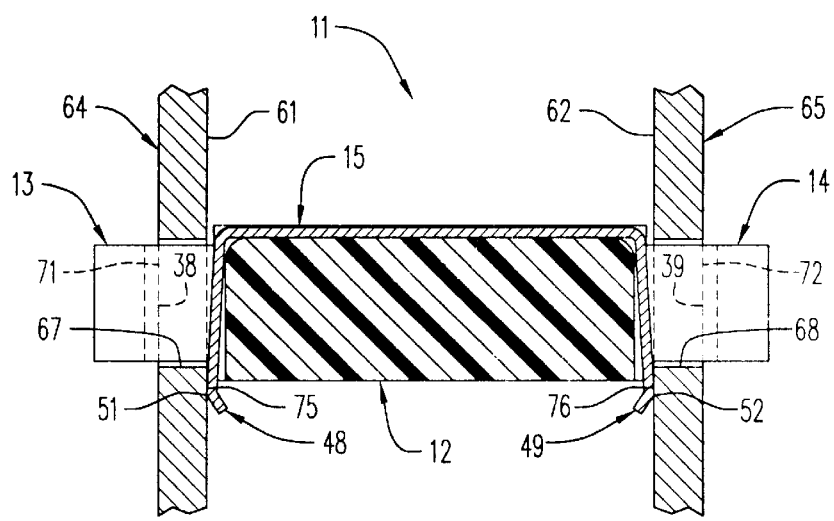
FIG. 7 is a cross-sectional view of the standoff shown in FIGS. 1—5 mounted between a pair of circuit boards.
Figure 4:
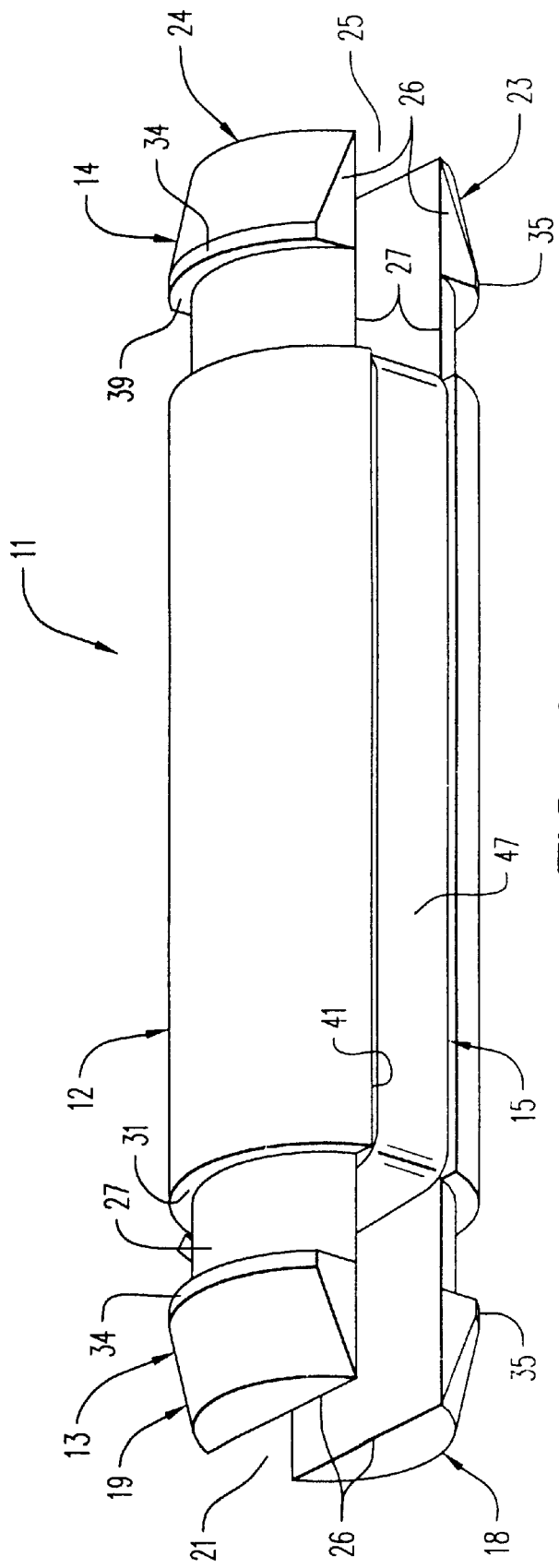
FIG. 4 is a top perspective view of the standoff shown in FIGS. 1—3.
Figure 5:
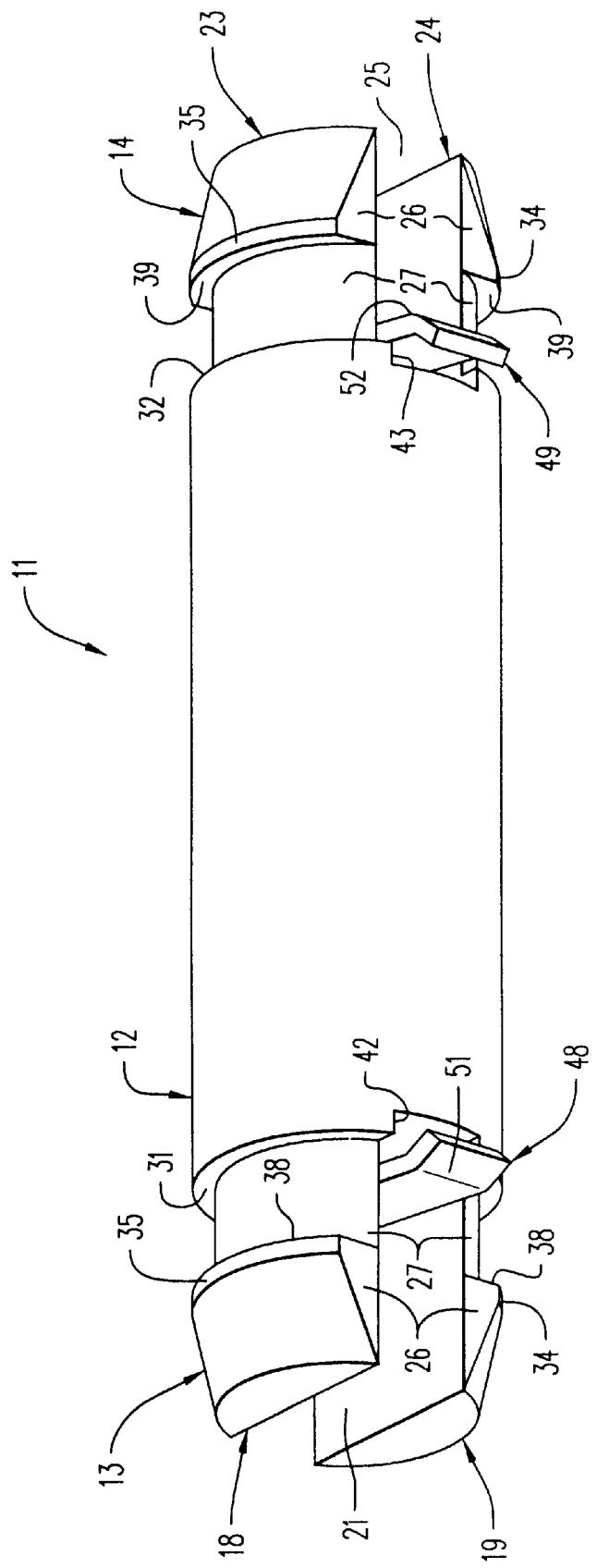
FIG. 5 is a bottom perspective view of the standoff shown in FIGS. 1—3.
Figure 6:
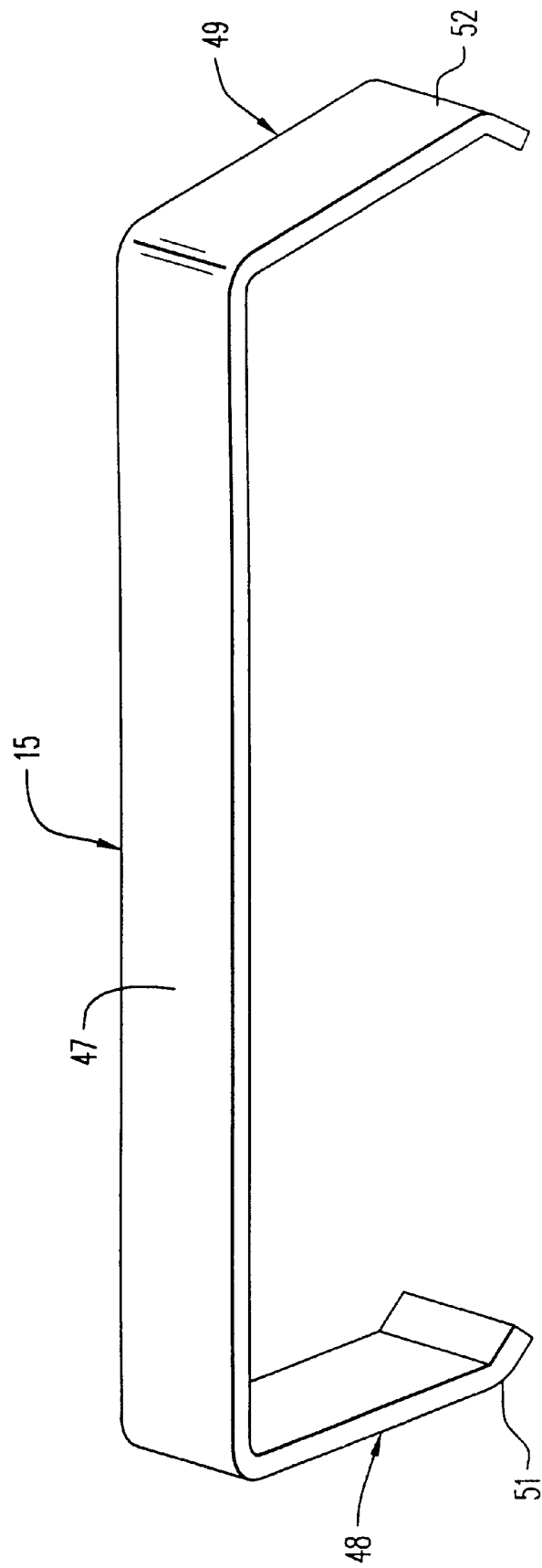
FIG. 6 is a perspective view of a spring contact member of the standoff shown in FIGS. 1—5.

During use of the standoff 11, the body portion 12 is disposed between facing inner surfaces 61, 62 of, respectively, first and second boards 64, 65 as shown in FIG. 7. Circular openings 67, 68 in the first and second boards 64, 65 are axially aligned with the body portion 12 and receive, respectively, the first and second latch portions 13, 14. The openings 67, 68 have diameters of a size intermediate those of the smaller stem portions 28, 29 and those of the larger, outer peripheral portions 34, 35. Consequently, passage of the first latch portion 13 through the opening 67 in the first board 64 requires inward flexing of the first and second legs 18, 19. After the head portions 26 have fully cleared the opening 67, the resilient legs 18, 19 spring outwardly to produce engagement between the latch surfaces 38 and outer surface portions 71 of the first board 64. In the fully inserted position of the first latch 13, an inner edge of the opening 67 is received by an annular recess 73 formed between the latch surfaces 38 and the first abutment surface 31. Similarly, passage of the second latch portion 14 through the opening 68 requires inward flexing of the first and second legs 23, 24 and after full penetration of the second latch 14, the resilient legs 23, 24 spring outwardly to produce engagement between the latch surfaces 39 of the second latch 14 and outer surface portions 72 of the second board 65. In that position of the second latch 14, an inner edge of the opening 68 in the second board 65 is received by an annular recess 74 between the latch surface 39 and the second abutment surface 32.

During the above described assembly operation, the first and second arm portions 48, 49 of the spring contact member 15 are forced into, respectively, the first and second transverse recesses 42, 43 as depicted in FIG. 7. Also, the first and second contact surfaces 51, 52 of the spring contact member 15 are brought into electrical contact with, respectively, conductive surfaces 75, 76 on the inner surfaces 61, 62 of the first and second boards 64, 65. Thus, the spring contact member 15 functions to provide an electrical ground connection between the first and second boards 64, 65. During the movement of the arm portions 48, 49 into the recesses 42, 43, the first and second contact surfaces 51, 52 are wiped across, respectively, the conductive surfaces 75, 76 to establish a good electrical contact therebetween.

Figure 8:
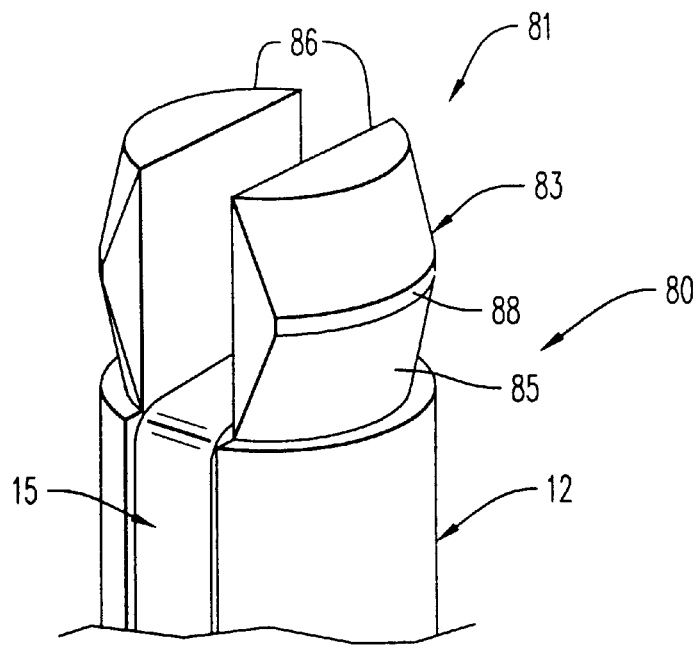
FIG. 8 is a perspective view of a modified latch mechanism for another standoff embodiment.

FIG. 8 illustrates another standoff embodiment 80 with a modified latch 81 for use with the body portion 12 of the standoff 11. The latch 81 can be substituted for either one or both of the first and second latches 13, 14 of the standoff 11. Forming the latch 81 are transversely spaced apart legs 82, 83 each having inner and outer portions 85, 86 of semi-conical cross-section and straddling a mid-portion 88 with a crescent cross-section. The outer surfaces of the mid-portions 88 lie on a circle concentric with the longitudinal axis of the body portion 12 and with a diameter slightly greater than the openings 67, 68 in the first and second boards 64, 65. During assembly of the standoff 80, insertion of the latch 81 requires inward flexing of the legs 82, 83 producing a latching interference fit between the mid-portions 88 and the inner surfaces of the openings 67, 68.

Figure 9:
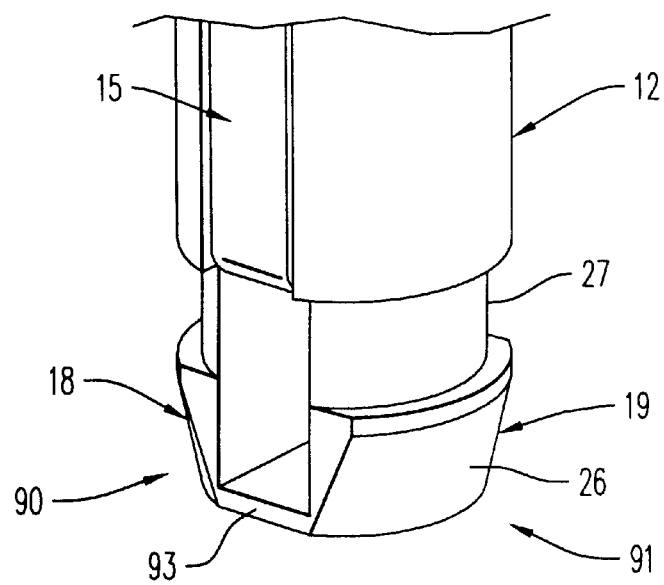
FIG. 9 is a perspective view of a modified latch mechanism for another standoff embodiment.

Illustrated in FIG. 9 is another standoff embodiment 90 having a modified latch 91 for use with the body portion 12 of the standoff 11. Again, the latch 91 can be substituted for either one or both of the first and second latches 13, 14 of the standoff 11. The latch 91 is identical to the latches 13, 14 except for the addition of an outer web portion 93 connecting outer ends of the legs 18, 19. Assembly of the standoff 90 utilizing the latch 91 is the same as described above for the standoff 11. However, inward flexing of the legs 18, 19 is restricted by the web portion 93 so as to require the exertion of greater force for either insertion or withdrawal.

Obviously, many modifications and variations of the present invention are possible in light of the above teachings. It is to be understood, therefore, that the invention can be practiced otherwise than as specifically described.

What is claimed is:

1. A circuit board standoff comprising:

body means for disposition between first and second boards so as to maintain a predetermined minimum spacing between substantially parallel facing inner surfaces thereof; said body means having at one end a first abutment surface for engaging an inner surface portion of the first board and at an opposite end a second abutment surface for engaging an inner surface portion of the second board, said first abutment surface and said second abutment surface being substantially aligned with a longitudinal axis of said body means;

a first latch means extending from said first abutment surface and being shaped and arranged to project through an opening in the first board and into latching engagement therewith;

a second latch means extending from said second abutment surface and being shaped and arranged to project through an opening in the second board and into latching engagement therewith; and a conductive spring contact member retained by said body means and having a first contact surface shaped and arranged to engage a first conductive surface on the first board, and a second contact surface shaped and arranged to engage a second conductive surface on the second board, said first contact surface and second contact surface being substantially aligned with said longitudinal axis.

2. A standoff according to claim 1 wherein said first latch means comprises a latch surface for contacting an outer surface portion of the first board.

3. A standoff according to claim 1 wherein said first latch means comprises spaced apart, resilient first and second legs defining, respectively, first and second outer peripheral portions adapted to be inwardly flexed by inner surface portions of the opening in the first board during passage therethrough.

4. A standoff according to claim 3 wherein said first and second legs define, respectively, first and second stem portions joining said body means and said first and second peripheral portions, and said first and second stem portions are separated by a spacing less than the spacing between said first and second peripheral portions.

5. A standoff according to claim 4 wherein each of said first and second legs further define a latch surface extending between said stem and peripheral portions, and shaped and arranged to contact an outer surface portion of the first board.

6. A standoff according to claim 1 wherein each of said first and second latch means comprises spaced apart, resilient first and second legs defining, respectively, first and second outer peripheral portions adapted to be inwardly flexed by inner surface portions of, respectively, the openings in the first and second boards during passage therethrough.

7. A standoff according to claim 6 wherein said first and second legs define, respectively, first and second stem portions joining said body means and said first and second peripheral portions, and said first and second stem portions are separated by a spacing less than the spacing between said first and second peripheral portions.

8. A standoff according to claim 7 wherein each of said first and second legs further define a latch surface extending between said stem and peripheral portions, and shaped and arranged to contact an outer surface portion of, respectively, the first and second boards.

9. A standoff according to claim 8 wherein said contact member comprises an elongated central portion retained by said body means and first and second arm portions extending transversely from opposite ends of said central portion and defining, respectively, said first and second contact surfaces.

10. A standoff according to claim 9 wherein said body means defines a longitudinal recess retaining said central portion;said first and second arm portions project between, respectively, said stem portions of said first and second latch means;and said body means further defines transverse first and second recesses for receiving, respectively, said first and second arm portions.

11. A standoff according to claim 10 wherein said first and second arm portions project longitudinally beyond, respectively, said first and second abutment surfaces.

12. A standoff according to claim 1 wherein said contact member comprises an elongated central portion retained by said body means and first and second arm portions extending transversely from opposite ends of said central portion and defining, respectively, said first and second contact surfaces.

13. A standoff according to claim 12 wherein said body means defines a longitudinal recess retaining said central portion;said first and second arm portions project between, respectively, said stem portions of said first and second latch means;and said body means further defines transverse first and second recesses for receiving, respectively, said first and second arm portions.

14. A standoff according to claim 13 wherein said first and second arm portions project longitudinally beyond, respectively, said first and second abutment surfaces.

15. A standoff according to claim 1 wherein said first and second latch means are shaped and arranged to project through circular openings in, respectively, the first and second boards.

16. A standoff according to claim 1 wherein said first and second latch means are shaped and arranged to project through openings substantially aligned with said longitudinal axis.

17. A standoff according to claim 16 wherein said body means, said first latch means, and said second latch means comprise an integrally molded unitary member.

18. A standoff according to claim 1 wherein said body means, said first latch means, and said second latch means comprise an integrally molded unitary member.

* * * * *